(12) United States Patent
Ummethala et al.

(10) Patent No.: US 11,284,018 B1
(45) Date of Patent: Mar. 22, 2022

(54) SMART CAMERA SUBSTRATE

(71) Applicant: Applied Materials, Inc., Santa Clara, CA (US)

(72) Inventors: Upendra Ummethala, Cupertino, CA (US); Philip Kraus, San Jose, CA (US); Keith Berding, San Jose, CA (US); Blake Erickson, Gilroy, CA (US); Patrick Tae, Palo Alto, CA (US); Devendra Channappa Holeyannavar, Bangalore (IN); Shivaraj Manjunath Nara, Bangalore (IN); Anandakumar Parameshwarappa, Chitradurga (IN); Sivasankar Nagarajan, Bangalore (IN); Dhirendra Kumar, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/021,992

(22) Filed: Sep. 15, 2020

(51) Int. Cl.
*H04N 5/247* (2006.01)
*H01L 21/67* (2006.01)
*H04N 5/225* (2006.01)

(52) U.S. Cl.
CPC ....... *H04N 5/247* (2013.01); *H01L 21/67276* (2013.01); *H04N 5/2256* (2013.01); *H04N 2005/2255* (2013.01)

(58) Field of Classification Search
CPC ................ H04N 5/247; H04N 5/2256; H04N 2005/2255; H01L 21/67276
See application file for complete search history.

(56) References Cited

U.S. PATENT DOCUMENTS 5,444,637 A * 8/1995 Smesny ................ B24B 37/013
257/E21.528
6,535,650 B1 * 3/2003 Poulo ..................... G06T 3/4038
382/284

(Continued)

FOREIGN PATENT DOCUMENTS

JP 2019-102728 6/2019

OTHER PUBLICATIONS

Criminale, et al., U.S. Appl. No. 16/890,008 entitled "Diagnostic Disc with a High Vacuum and Temperature Tolerant Power Source" filed Jun. 2, 2020, 79 pgs.

(Continued)

*Primary Examiner* — Richard A Hansell, Jr.
(74) *Attorney, Agent, or Firm* — Schwabe, Williamson & Wyatt, P.C.

(57) ABSTRACT

Embodiments disclosed herein include a diagnostic substrate, comprising a baseplate, and a first plurality of image sensors on the baseplate, where the first plurality of image sensors are oriented horizontal to the baseplate. In an embodiment, the diagnostic substrate further comprises a second plurality of image sensors on the baseplate, where the second plurality of image sensors are oriented at a non-orthogonal angle to the baseplate. In an embodiment, the diagnostic substrate further comprises a printed circuit board (PCB) on the baseplate, and a controller on the baseplate, where the controller is communicatively coupled to the first plurality of image sensors and the second plurality of image sensors by the PCB. In an embodiment, the diagnostic substrate further comprises a diffuser lid over the baseplate, the PCB, and the controller.

18 Claims, 8 Drawing Sheets

(56) References Cited

U.S. PATENT DOCUMENTS

| | | | |
|---|---|---|---|
| 6,734,027 B2 * | 5/2004 | Jonkers | G01N 7/02 438/14 |
| 6,807,503 B2 | 10/2004 | Ye et al. | |
| 6,820,028 B2 | 11/2004 | Ye et al. | |
| 7,135,852 B2 | 11/2006 | Renken et al. | |
| 7,233,874 B2 * | 6/2007 | Ye | G01D 9/005 438/18 |
| 7,283,255 B2 | 10/2007 | Ramsey et al. | |
| 7,331,250 B2 | 2/2008 | Hunter | |
| 7,434,485 B2 | 10/2008 | Hunter | |
| 7,819,033 B2 * | 10/2010 | Renken | H01L 22/34 73/866.1 |
| 7,855,549 B2 | 12/2010 | Renken | |
| 8,260,461 B2 | 9/2012 | Krishnasarny et al. | |
| 8,600,150 B2 | 12/2013 | Lee et al. | |
| 8,751,047 B2 | 6/2014 | Rodnick et al. | |
| 9,111,979 B2 | 8/2015 | Fairbaim | |
| 9,831,110 B2 | 11/2017 | Francken et al. | |
| 10,748,798 B1 * | 8/2020 | Tsai | C23C 16/45565 |
| 2003/0202092 A1 | 10/2003 | Sadighi et al. | |
| 2005/0233770 A1 * | 10/2005 | Ramsey | H01L 21/67253 455/561 |
| 2005/0246124 A1 * | 11/2005 | Tomer | H01L 22/26 702/117 |
| 2005/0246127 A1 * | 11/2005 | Renken | H01L 21/67253 702/117 |
| 2006/0171561 A1 | 8/2006 | Ramsey et al. | |
| 2007/0028669 A1 * | 2/2007 | Brewster | F04B 37/14 73/31.03 |
| 2013/0122332 A1 * | 5/2013 | van Lammeren | H01M 10/48 429/61 |
| 2014/0125370 A1 * | 5/2014 | Lin | G01R 1/07364 324/755.07 |
| 2015/0049172 A1 * | 2/2015 | Ramachandra | G06T 7/85 348/47 |
| 2016/0216185 A1 | 7/2016 | Gottscho | |
| 2017/0028560 A1 | 2/2017 | Senn | |
| 2017/0053819 A1 | 2/2017 | Richardson | |
| 2017/0263478 A1 | 9/2017 | McChesney et al. | |
| 2019/0057889 A1 * | 2/2019 | Mao | C23C 16/52 |
| 2019/0252163 A1 | 8/2019 | Gottscho | |
| 2019/0325601 A1 | 10/2019 | Chen et al. | |

OTHER PUBLICATIONS

Criminale, et al., U.S. Appl. No. 16/890,013 entitled "Diagnostic Disc with a High Vacuum and Temperature Tolerant Power Source" filed Jun. 2, 2020, 73 pgs.

International Search Report and Written Opinion from Patent Application No. PCT/US2021/045731 dated Dec. 3, 2021, 11 pgs.

* cited by examiner

SMART CAMERA SUBSTRATE

BACKGROUND

1) Field

Embodiments of the present disclosure pertain to the field of semiconductor processing and, in particular, to smart camera substrates that are capable of providing imaging within a chamber without needing to take the chamber offline.

2) Description of Related Art

In the operation of semiconductor manufacturing tools, the tool may have process drift during the processing of many wafers. For example, even when the same processing parameters (e.g., pressures, temperatures, gas flow rates, power etc.) are used, the outcome on the wafer may be non-uniform between wafers. This process drift may be attributable, at least in part, to depositions on the interior surfaces of the chamber of the tool and the degradation of tool hardware.

However, it is currently not possible to visibly inspect the interior of the chamber without taking the chamber offline. Additionally, even if a camera or other sensor can be provided in the interior of a chamber, there is typically not a light source within the chamber. As such, a camera is not able to take images of the interior of the chamber. Therefore, the chamber can only be inspected when the vacuum is released and the chamber is opened. This produces a significant down time for the tool and is undesirable.

SUMMARY

Embodiments of the present disclosure include diagnostic substrates and methods using diagnostic substrates for chamber monitoring.

In an embodiment, a diagnostic substrate is disclosed. The diagnostic substrate may comprise a baseplate and a plurality of image sensors on the baseplate. In an embodiment, the diagnostic substrate may further comprise a printed circuit board (PCB) on the baseplate, and a controller on the baseplate. In an embodiment, the PCB electrically couples the controller to the plurality of image sensors.

In an embodiment, a method for using a diagnostic substrate to image an interior of a chamber is described. A method of imaging the interior of a chamber comprises providing a diagnostic substrate, where the diagnostic substrate comprises a plurality of image sensors and a light source, and inserting the diagnostic substrate into the chamber, where the chamber is maintained at a sub-atmospheric pressure. In an embodiment, the method further comprises turning on the light source, and obtaining images of an interior of the chamber with the plurality of image sensors.

Additional embodiments disclosed herein include a diagnostic substrate, comprising a baseplate, and a first plurality of image sensors on the baseplate, where the first plurality of image sensors are oriented horizontal to the baseplate. In an embodiment, the diagnostic substrate further comprises a second plurality of image sensors on the baseplate, where the second plurality of image sensors are oriented at a non-orthogonal angle to the baseplate. In an embodiment, the diagnostic substrate further comprises a printed circuit board (PCB) on the baseplate, and a controller on the baseplate, where the controller is communicatively coupled to the first plurality of image sensors and the second plurality of image sensors by the PCB. In an embodiment, the diagnostic substrate further comprises a diffuser lid over the baseplate, the PCB, and the controller.

DETAILED DESCRIPTION

Figure 1A:
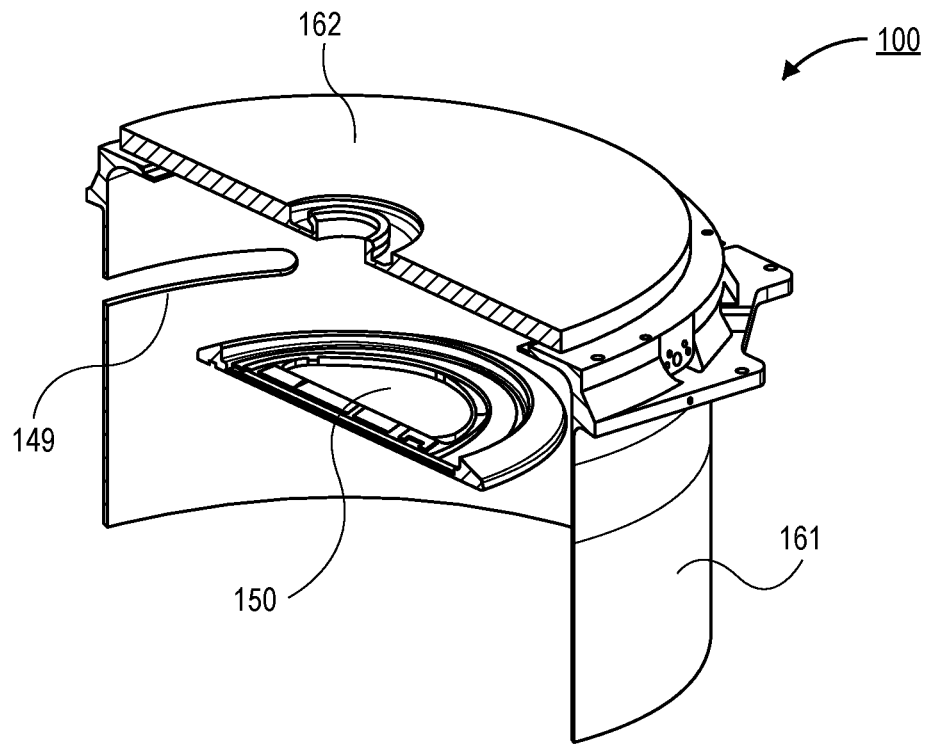
FIG. 1A is an illustration of a processing chamber with a diagnostic substrate in the chamber, in accordance with an embodiment disclosed herein.

Smart camera wafers that are capable of providing imaging within a chamber without needing to take the chamber offline, are described. In the following description, numerous specific details are set forth of a diagnostic substrate with imaging sensors and a light source in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, chamber drift may be attributable to the changing conditions within a chamber. For example, byproduct deposition on chamber surfaces (e.g., a liner, the lid, etc.) may alter the performance of a process being run in the chamber. This may result in wafer non-uniformity. However, there are currently no diagnostic tools to visually monitor changing chamber conditions without taking the chamber offline, and opening up the chamber.

Accordingly, embodiments disclosed herein include a diagnostic substrate that can be inserted into the chamber of the processing tool. The diagnostic substrate may comprise a plurality of cameras in order to image the interior of the chamber. In order to provide a light source, one or more light emitting diodes (LEDs) may also be provided on the diagnostic substrate. The LEDs may be provided under a light diffuser in order to minimize the presence of reflections and provide higher quality images. In an embodiment where multiple cameras are used, the individual images may be stitched together to provide a single image of the interior of the chamber. As such, a simple check of the image allows for a determination of whether tool maintenance is needed.

In an embodiment, the diagnostic substrate may have a form factor that is compatible with semiconductor wafer handling equipment. As such, the diagnostic substrate may be fed into the chamber through a factory interface and a mainframe. That way, the tool does not need to be taken completely offline in order to provide images of the interior of the chamber. For example, the diagnostic substrate may have a form factor similar to wafer form factors (e.g., 300 mm, 450 mm, etc.). However, it is to be appreciated that the diagnostic substrate may also include form factors other than typical wafer form factors. As such, diagnostics may be completed more frequently without significant downtime of the chamber. The ability to provide frequent checks of the chamber interior may also extend out the length of time between planned maintenance (PM). As such, the processing capacity of the tool is more fully realized. Additionally, since the diagnostic substrate is portable between chambers, there is a low overhead cost compared to the need for dedicated sensors for each chamber.

Referring now to FIG. 1A, an illustration of a processing tool 100 is shown, in accordance with an embodiment. In an embodiment, the processing tool 100 may comprise a chamber liner 161 and a lid 162 for sealing the chamber 161. Embodiments disclosed herein include a diagnostic substrate 150 that is supported on a lift pins (not shown) below the lid 162. The diagnostic substrate 150 may have a form factor that allows the diagnostic substrate 150 to be inserted through a slit valve 149. As such, the chamber lid 162 does not need to be removed (and the vacuum released) in order to provide diagnostics with the diagnostic substrate 150. For example, the diagnostic substrate 150 may have a thickness that is approximately 10 mm or less. The diameter of the diagnostic substrate 150 may be similar to that of wafers processed in the processing tool 100 (e.g., 300 mm, 450 mm, etc.).

In an embodiment, the diagnostic substrate 150 comprises a plurality of image sensors and a light source. The light source illuminates the interior of the chamber 161, and the image sensors provide images of the surface of the chamber 161 and lid 162. Accordingly, the state of the chamber can be determined without needing to take the chamber completely offline. A more detailed description of the image sensors and the light source are provided below.

Figure 1B:
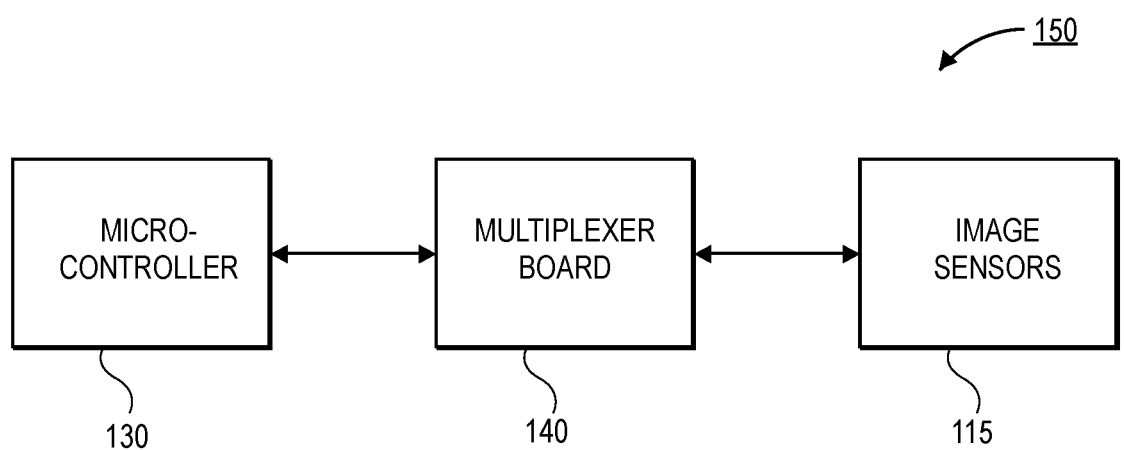
FIG. 1B is a block diagram of components of the diagnostic substrate, in accordance with an embodiment disclosed herein.

Referring now to FIG. 1B, a block diagram of the diagnostic substrate 150 is shown, in accordance with an embodiment. In an embodiment, the diagnostic substrate 150 comprises a microcontroller 130. The microcontroller 130 may be any suitable integrated circuit die that can be programed to execute the capturing of images using the image sensors. In an embodiment, the microcontroller 130 is coupled to a plurality of image sensors 115 through a multiplexer board 140. The multiplexer board 140 allows for individual control of the image sensors 115 in order to sequentially obtain images from each of the image sensors 115. That is, in some embodiments, a single image sensor 115 is utilized at a time. However, embodiments are not limited to such configurations, and multiple image sensors 115 may simultaneously be utilized when the microcontroller 130 is configured to accept multiple inputs at the same time.

Figure 2A:
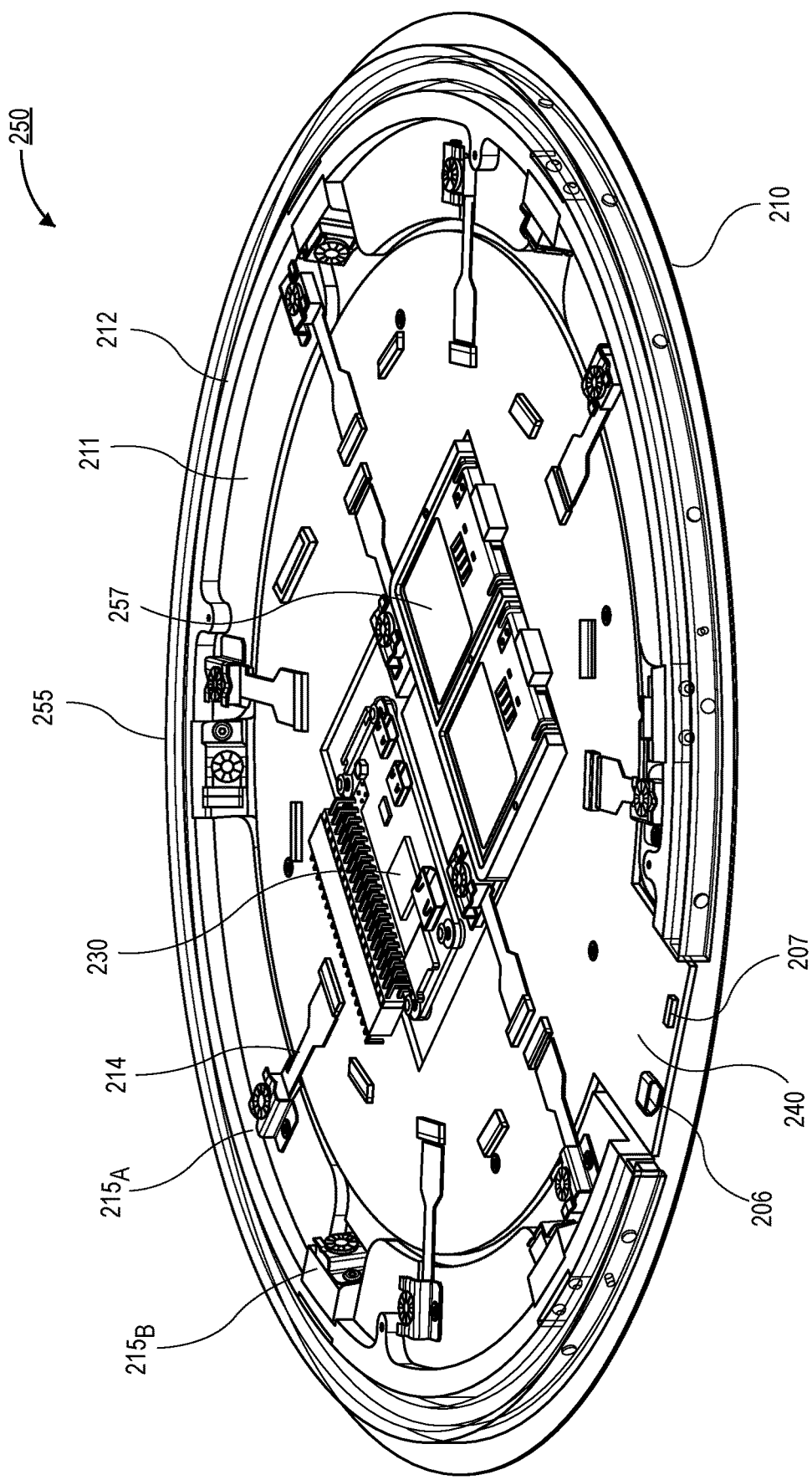
FIG. 2A is an illustration of a diagnostic substrate with the lid removed, in accordance with an embodiment disclosed herein.

Referring now to FIG. 2A, a perspective view illustration of a diagnostic substrate 250 is shown, in accordance with an embodiment. In the illustration in FIG. 2A, a lid of the diagnostic substrate 250 is omitted in order to see the internal components of the diagnostic substrate 250. As noted above, the diagnostic substrate 250 may have a form factor suitable for handling with automated handling systems, such as those in a factory interface or mainframe. For example, the diagnostic substrate 250 may have a thickness less than approximately 10 mm and a diameter that substantially matches the diameter of device wafers (e.g., 300 mm or 450 mm).

In an embodiment, the diagnostic substrate 250 comprises a baseplate 210. The baseplate 210 may be the frame for holding various components of the diagnostic substrate 250. In an embodiment, the baseplate 210 comprises a ridge 211 and a wall 212. The ridge 211 and the wall 212 may have substantially circular shapes and be positioned proximate to an edge of the baseplate 210. However, as shown in FIG. 2A, the ridge 211 and wall 212 may not be complete circles. For example, an opening to access a charging port 206 and a power switch 207 on the printed circuit board (PCB) 240 may be provided.

In an embodiment, a plurality of image sensors 215 are provided around a perimeter of the baseplate 210. In an embodiment, the image sensors 215 are positioned on the ridge 211 adjacent to the wall 211. For example, horizontal image sensors $215_A$ are provided on the ridge 211. In an embodiment, angled image sensors $215_B$ are provided against the wall 212. The angled image sensors $215_B$ are shown as being provided in recesses in the ridge 211. However, it is to be appreciated that the angled image sensors $215_B$ may also be placed on top of the ridge 211 in some embodiments. In an embodiment, additional horizontal image sensors $215_A$ may also be provided at other locations of the baseplate 210 away from the ridge 211 and the wall 212. For example, a pair of horizontal image sensors $215_A$ are provided proximate to a center of the baseplate in FIG. 2A.

In an embodiment, the horizontal image sensors $215_A$ are provided to capture images of the lid of the chamber, and the angled image sensors $215_B$ are provided to capture images of the sidewalls of the chamber or chamber liner. The horizontal image sensors $215_A$ may be oriented substantially horizontal to the baseplate 210. That is, the field of view (FOV) of the horizontal image sensors $215_A$ is facing away from the baseplate 210. The angled image sensors $215_B$ may be oriented at a non-orthogonal angle with respect to the baseplate. In a particular embodiment, the angled image sensors $215_B$ are between 0° and 20° from orthogonal to the baseplate. The FOV of the angled image sensors $215_B$ is directed towards the axial center of the baseplate.

In an embodiment, the number and positioning of the image sensors 215 is dictated by the FOV of the image sensors 215 and the geometry of the chamber being investigated. In some embodiments, the image sensors 215 are oriented so that there is an overlap in the FOV of neighboring image sensors 215. For example, the overlap may be approximately 20% between neighboring sensors 215. As such, a stitched image of the entire interior surface of the chamber can be generated. In the particular embodiment shown in FIG. 2A there are six angled image sensors $215_B$, and ten horizontal image sensors $215_A$.

In an embodiment, the image sensors 215 may comprise image sensors for capturing the visible spectrum of light. In other embodiments, the image sensors 215 may be suitable for capturing thermal radiation. In some embodiments, the image sensors 215 may be suitable for capturing thermal radiation and visible light. In a particular embodiment, the image sensors 215 are 8 megapixel cameras. Though it is to be appreciated, that the resolution of the cameras may vary depending on the resolution of the images needed to provide the diagnostics.

In an embodiment, the image sensors 215 are electrically coupled to the PCB 240 by cables 214. The cables 214 may be flex cables or any other suitable interconnect architecture. In an embodiment, the PCB 240 may provide electrical coupling from the cables 214 to the controller 230. The PCB 240 may include multiplexing/demuxing capabilities in order to allow for the image sensors 215 to be individually addressable by the controller 230.

In an embodiment, the diagnostic substrate 250 may be powered by one or more batteries 257. In the illustrated embodiment, the batteries are shown as being exposed to the atmosphere. However, it is to be appreciated that in other embodiments, the batteries are in a hermetically sealed chamber. Such an embodiment will be described in greater detail below. Hermetically sealing the batteries 257 allows for operation of the diagnostic substrate in a sub-atmospheric pressure environment. As such, the chamber vacuum does not need to be lost to enable the imaging within the chamber. In a particular embodiment, the batteries may have a voltage of 3.7V, though embodiments are not limited to such voltages.

In an embodiment, the diagnostic substrate 250 may further comprise a light source. For example, the light source may comprise a light emitting diode (LED) strip 255. The LED strip 255 may surround a perimeter of the diagnostic substrate 250. For example, the LED strip 255 may wrap around an outer surface of the wall 212. In an embodiment, the LED strip 255 may comprise a diffuser in order to emit diffuse light within the chamber. As such, reflections within the chamber are avoided and the image quality is improved. In other embodiments, the diffuser may be incorporated as part of the lid, as will be described in greater detail below.

Figure 2B:
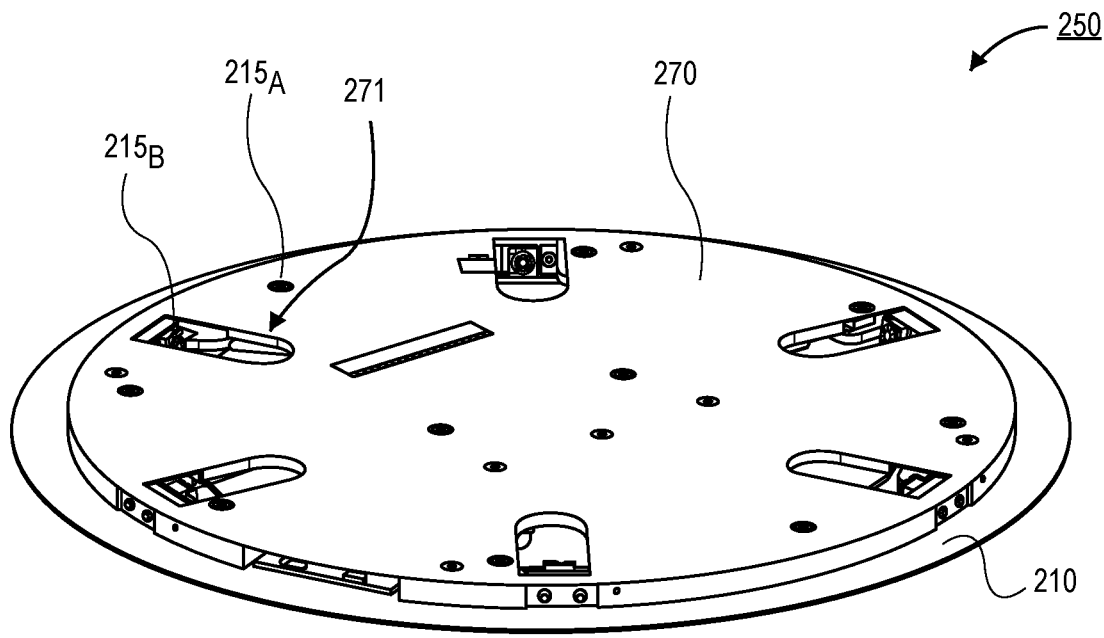
FIG. 2B is an illustration of a diagnostic substrate with the lid included, in accordance with an embodiment disclosed herein.

Referring now to FIG. 2B a perspective view illustration of the diagnostic substrate 250 with a lid 270 attached is shown, in accordance with an embodiment. In an embodiment, the lid 270 may have openings to allow for the image sensors to "see" through the lid 270. The openings above the horizontal image sensors $215_A$ may be formed to have a dimension that substantially matches the dimension of the lens of the horizontal image sensors $215_A$. The openings 271 for the angled image sensors $215_B$ may be elongated. The elongated opening is needed to allow for the complete FOV of the angled image sensors $215_B$ to pass through the lid 270. The length dimension of the openings 271 may be dictated by the FOV of the angled image sensors $215_B$ and the angle of the image sensors $215_B$ relative to the baseplate 210. In an embodiment, the lid 270 may be translucent. A translucent lid 270 may aid in the diffusion of the light from the light source 255. For example, the lid 270 may be 70% white (i.e., the lid 270 may let 30% of the light through).

Figure 2C:
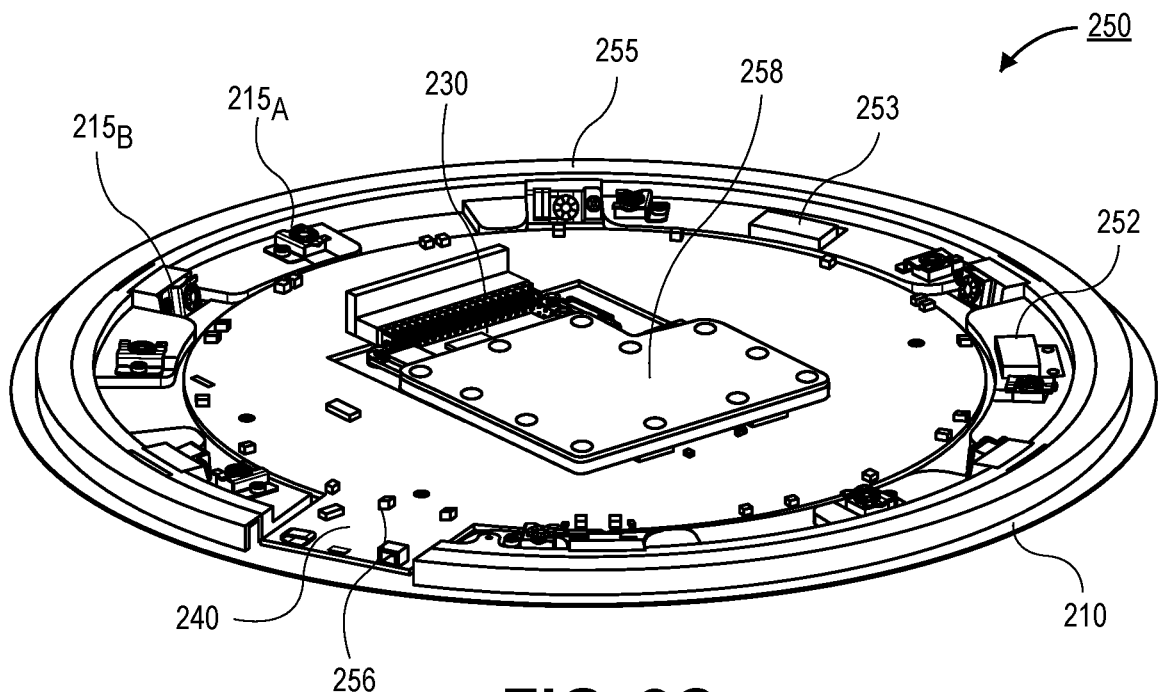
FIG. 2C is an illustration of a diagnostic substrate with a hermetically sealed battery and a plurality of light emitting diodes (LEDs) across the printed circuit board (PCB), in accordance with an embodiment disclosed herein.

Referring now to FIG. 2C, a perspective view illustration of a diagnostic substrate 250 is shown, in accordance with an additional embodiment. The diagnostic substrate 250 in FIG. 2C may be substantially similar to the diagnostic substrate 250 in FIG. 2A with the exception of the inclusion of additional LEDs 256 and a hermetically sealed battery module 258. The diagnostic substrate 250 in FIG. 2C also illustrates the inclusion of additional sensors, such as a temperature sensor 253 and a vibration sensor 252. Such sensors may be used to monitor temperature and vibrations so that they do not exceed limits for safe operation of the diagnostic substrate 250.

In an embodiment, the additional LEDs 256 may be surface mounted devices (SMDs) that are attached to the PCB 240. The LEDs 256 may be distributed across the PCB 240. In an embodiment, the LEDs 256 provide additional light to the interior of the chamber during operation. In an additional embodiment, the LED strip 255 may be omitted. That is, substantially all of the light used during imaging may be provided by the SMD LEDs 256. The point source lighting may be more susceptible to reflections. As such, the lid 270 provides diffusion in order to minimize reflections within the chamber. In an embodiment, the SMD LEDs 256 and/or the LED strip 255 may also be individually controllable (or controlled in groups) to allow for improved illumination control. By selectively turning on/off individual or groups of SMD LEDs and/or the LED strip, specular reflections can be limited while obtaining images with the image sensors 215.

In an embodiment, the battery module 258 is hermetically sealed. That is, the pressure within the battery module 258 is maintained when the exterior pressure changes. As such, the battery (or batteries) within the battery module may remain substantially at atmospheric pressure, even when the diagnostic substrate 250 is exposed to vacuum pressures within a chamber.

Figure 2D:
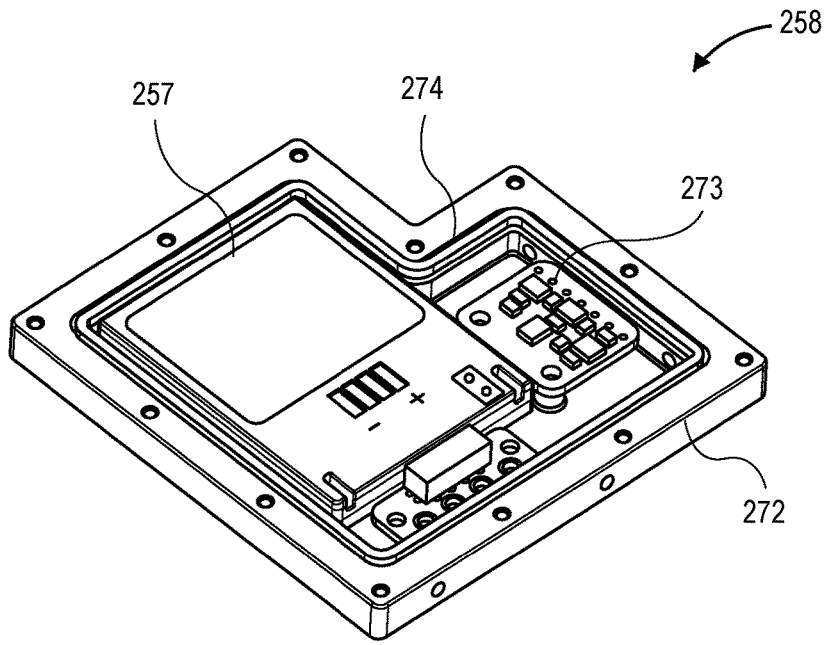
FIG. 2D is an illustration of the battery module packaging of the diagnostic substrate, in accordance with an embodiment disclosed herein.

Referring now to FIG. 2D, a perspective view illustration of the battery module 258 is shown in greater detail. In FIG. 2D, the lid of the battery module 258 is removed to expose the interior features of the battery module 258. As shown, the battery module 258 comprises an enclosure 272 that surrounds a perimeter of the battery 257. A gasket 274 may be provided along an interior surface of the enclosure 272. When the lid (not shown) is attached to the enclosure 272, the gasket 274 is compressed in order to provide the hermetic seal. In an embodiment, the battery module 258 remains hermetically sealed when the external pressure is approximately 15 mTorr or less. In an embodiment, the battery module 258 may further comprise one or more sensors 273 such as a pressure sensor and a VOC sensor. A pressure sensor provides feedback for hermeticity of the battery module 258. A VOC sensor would indicate if the batteries 257 were compromised due to heat or other reasons. A temperature sensor may be monitored whenever the diagnostic substrate 250 is in the chamber and logged in a non-volatile log as an indication of battery health. Decisions to continue using or discarding the battery 257 may be made based on exposure temperature and time, as well as other electrical properties of the batteries.

Figure 3A:
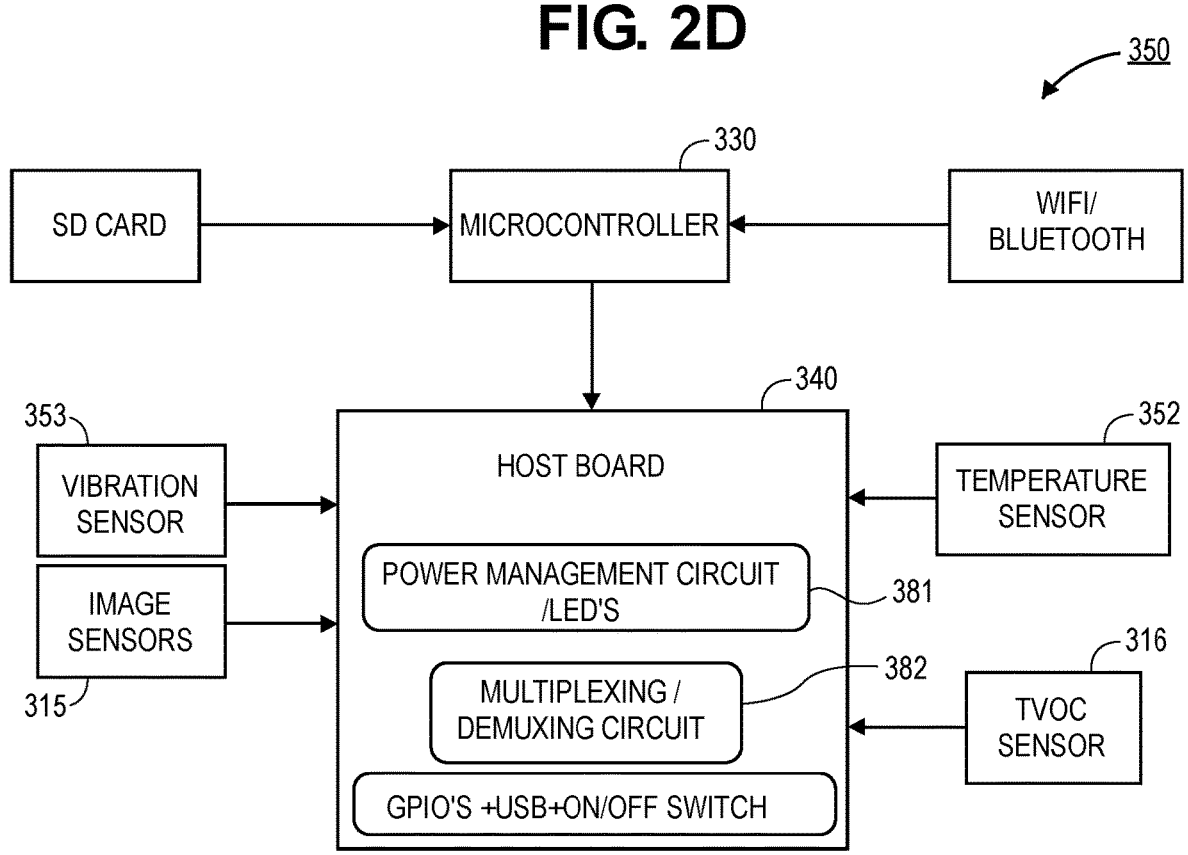
FIG. 3A is a block diagram of the diagnostic substrate, in accordance with an embodiment disclosed herein.

Referring now to FIG. 3A, a control block diagram illustration of the components of the diagnostic substrate 350 is shown, in accordance with an embodiment. In an embodiment the system comprises a microcontroller 330 and a host board 340 (e.g., PCB). FIG. 3A illustrates how the various components interact with each other in order to provide chamber monitoring with the diagnostic substrate 350.

In an embodiment, the diagnostic substrate 350 comprises a microcontroller 330. The microcontroller 330 is communicatively coupled to a memory (such as an SD card) and/or to a wireless communication interface (e.g., WiFi, Bluetooth, etc.). In an embodiment, the memory may be local to the microcontroller 330. In such embodiments, image data is stored locally to the diagnostic substrate 350. In other embodiments, the wireless communication interface may allow for image data to be transmitted wirelessly to an external device.

In an embodiment, the host board 340 comprises power management circuitry 381 and multiplexing/demuxing circuitry 382. The host board 340 also provides features for on/off switching, USB interconnection, and GPIOs. In an embodiment, the host board 340 provides routing for transmitting data to the microcontroller from various sensors. While image sensors 315 have been described in greater detail above, it is to be appreciated that other sensors may be included to provide enhanced functionality. For example, vibration sensors 353, temperature sensors 352, and total volatile organic compounds (TVOC) sensors 316 may be included. The sensors 315, 316, 352, 353 may utilize any suitable communication protocol. In a particular embodiment, the communication is implemented using the I$^2$C communication protocol.

Figure 3B:
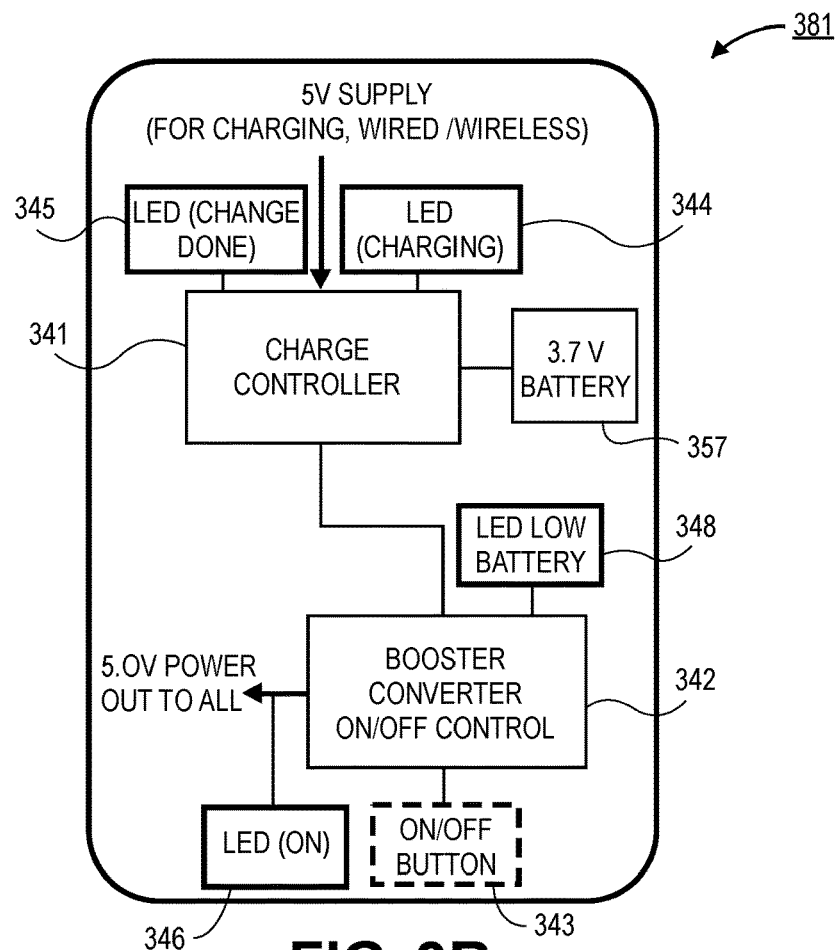
FIG. 3B is a block diagram of the power management module of the diagnostic substrate, in accordance with an embodiment disclosed herein.

Referring now to FIG. 3B, a block diagram of the power management circuitry 381 is shown, in accordance with an embodiment. In an embodiment, the power management circuitry 381 comprises a charge controller 341. The charge controller 381 may be coupled to a battery 357. A charging input (e.g., 5V supply) may be used to charge the battery 357 using wired or wireless charging. A first LED 344 connected to the charge controller 341 may be an indicator for charging, and a second LED 345 connected to the charge controller 341 may be an indicator for a completed charge.

In an embodiment, the charge controller 341 is coupled to a boost converter and on/off control block 342. In an embodiment, a third LED 348 may be connected to the boost converter 342 to indicate a low battery power. An on/off switch or button may also be connected to the boost converter 342. A fourth LED 346 may provide an on/off indicator. In an embodiment, the boost converter upconverts the lower voltage of the battery to a higher voltage (e.g., 5V) to power the components of the diagnostic substrate.

Figure 3C:
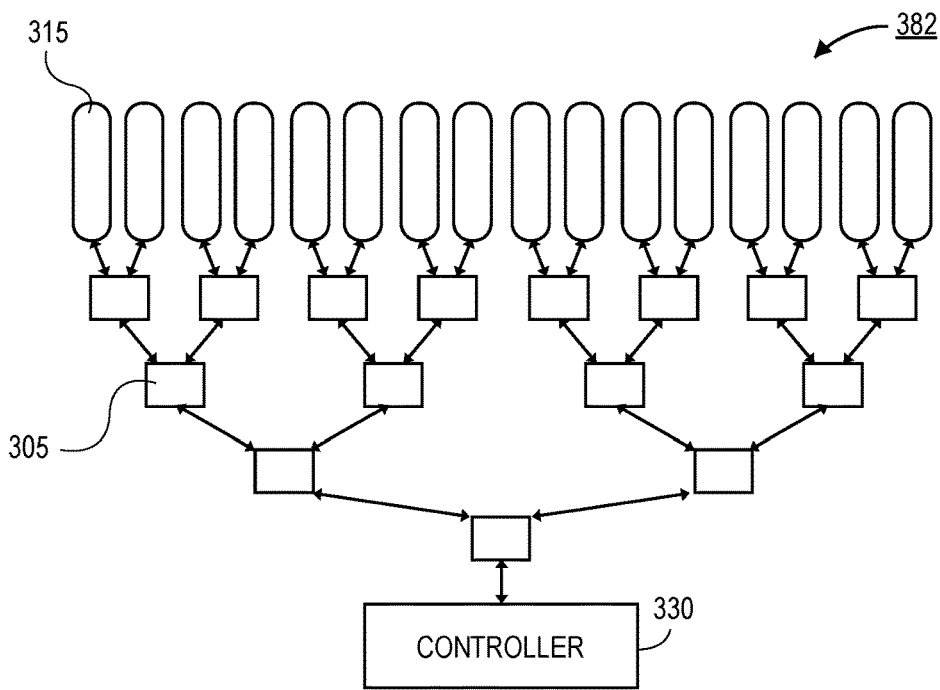
FIG. 3C is a schematic of the multiplexer for individually selecting image sensors, in accordance with an embodiment disclosed herein.

Referring now to FIG. 3C, a schematic of the multiplexing/demuxing circuit 382 is shown, in accordance with an embodiment. In an embodiment, the controller is connected to each of the image sensors 315 through a branched network comprising a plurality of switches 305. By activating a series of switches, the sensors 315 may be individually activated. Accordingly, a multi-output-single-input architecture is all that is needed to utilize the plurality of image sensors 315.

Figure 4:
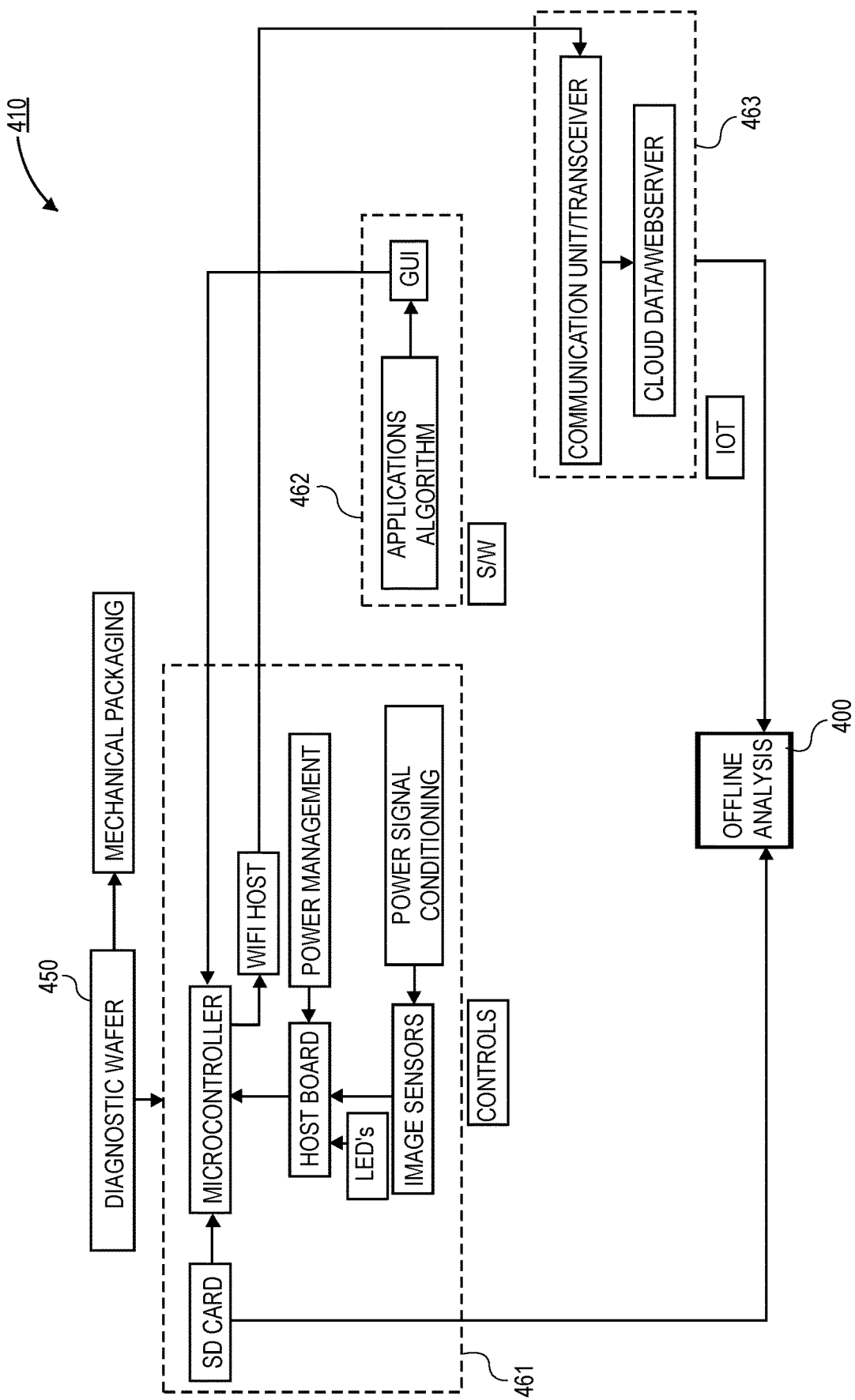
FIG. 4 is a system level block diagram of the processing tool that utilizes a diagnostic substrate, in accordance with an embodiment disclosed herein.

Referring now to FIG. 4, a system level diagram of the diagram 410 of how the diagnostic substrate 450 functions with an offline analysis machine 400. As shown, the diagnostic substrate 450 comprises mechanical packaging and controls 461. The mechanical packaging is similar to architectures described above. The controls 461 include a microcontroller, a host board, and the image sensors. LEDs (for indicating various states, such as charging, charge completed, low power, and on/off) and a power management block may be connected to the host board. A power signal conditioning block may control the voltage supplied to the image sensors, which are also connected to the host board.

In an embodiment, a memory (e.g., S/D card) may be coupled to the microcontroller for storing data. The memory may be removed from the diagnostic substrate 450 and sent to an offline analysis machine 400 for analysis. Additionally (or alternatively), a wireless communication block (e.g., a WiFi host block) may be connected to the microcontroller for wirelessly sending data from the diagnostic substrate to a server block 463, and ultimately to the offline analysis machine 400. The server block 463 may comprise a communication unit/transceiver and a cloud data/webserver.

In an embodiment, the microcontroller may also have access to a software block 462. The software block 462 may include an applications algorithm and a graphical user interface (GUI). The software block 462 may be remote from the diagnostic substrate 450, or stored on the diagnostic substrate 450 (e.g., in a local memory).

Figure 5:
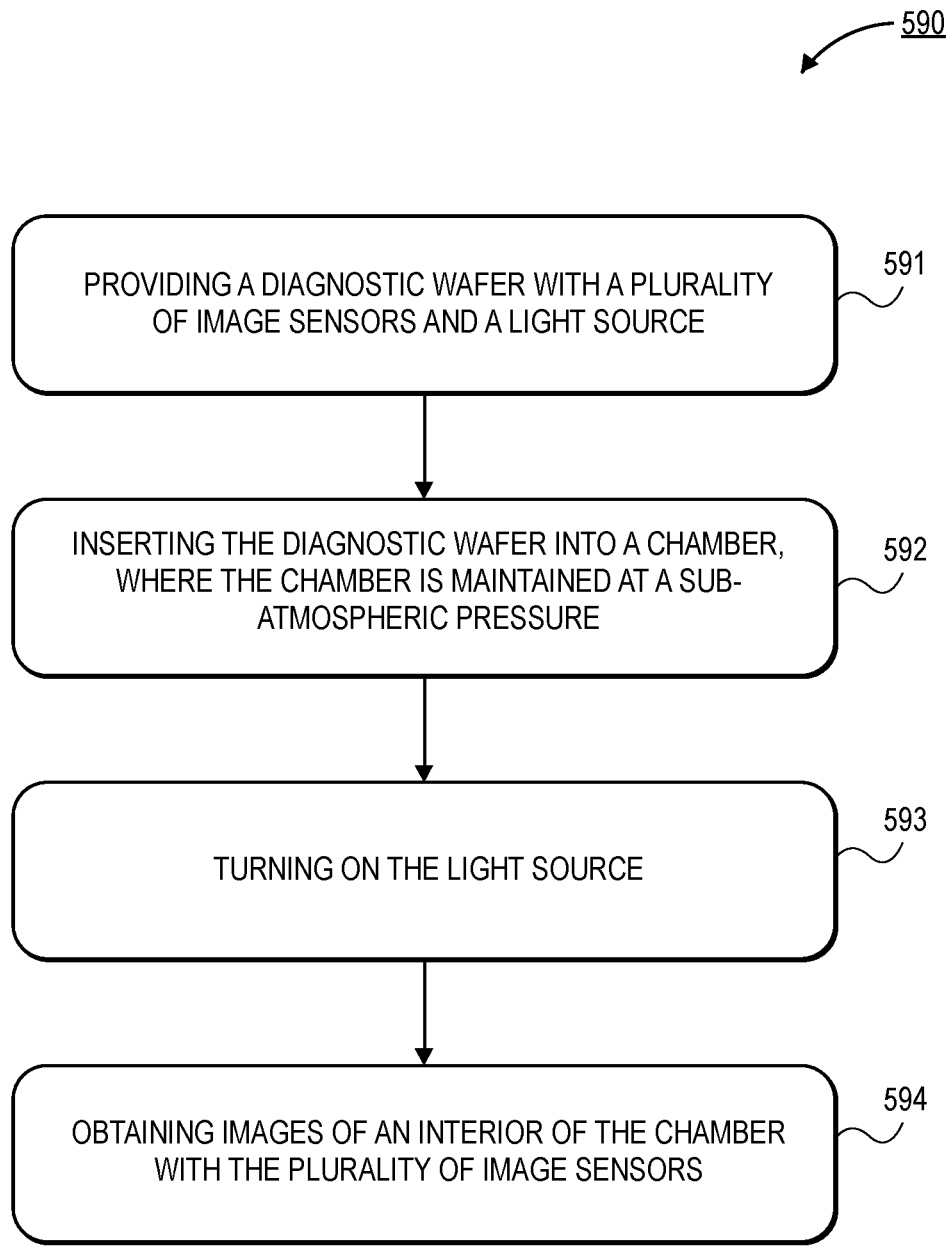
FIG. 5 is a flowchart of a method of using the diagnostic substrate, in accordance with an embodiment disclosed herein.

Referring now to FIG. 5, a flowchart illustrating a process 590 for monitoring a chamber is shown, in accordance with an embodiment. In an embodiment, the monitoring of the chamber may include the obtaining of images of the interior of the chamber using a diagnostic substrate. Particularly, the process 590 is implemented without releasing the vacuum within the chamber or cooling the chamber body. In an embodiment, the chamber may be any chamber used in semiconductor manufacturing processes. For example, the chamber may be a plasma chamber for use in deposition of materials or for etching, though embodiments are not limited to such chambers.

Process 590 may begin with operation 591, which includes providing a diagnostic substrate with a plurality of image sensors and a light source. The diagnostic substrate may be similar to the diagnostic substrates described above. For example, the image sensors may include horizontal image sensors that are oriented to provide images of a chamber lid, and angled image sensors that are oriented to provide images of the sidewalls of the chamber or a chamber liner. In an embodiment, the image sensors may include visible spectrum images and/or thermal imaging. In an embodiment, the light source may comprise an LED strip and/or discrete surface mounted LEDs. A diffuser plate may be provided as a lid over the diagnostic substrate in order to minimize reflections within the chamber.

Process 590 may continue with operation 592, which includes inserting the diagnostic substrate into a chamber. In an embodiment, the diagnostic substrate is inserted into a chamber while a sub-atmospheric pressure (e.g., a vacuum pressure) is maintained in the chamber. For example, the sub-atmospheric pressure may be approximately 15 mTorr or less. In an embodiment, the diagnostic substrate is inserted into the chamber using automated substrate handling equipment. For example, the diagnostic substrate may be extracted from a cassette by a factory interface (FI). The FI may then insert the diagnostic substrate into a load lock, and a mainframe robot removes the diagnostic substrate from the load lock and inserts the diagnostic substrate into a chamber through a slit valve.

Process 590 may continue with operation 593, which includes turning on the light source. In an embodiment, the light source illuminates the inside of the chamber that is otherwise dark. The light source may comprise a diffuser in order to limit reflections within the chamber that would detract from the image quality. In an embodiment, the light source may be turned on when the diagnostic substrate is in the chamber, or the light source may be turned on before the diagnostic substrate is in the chamber. In an embodiment, the light source may include LEDs that are individually controllable (or controlled in groups) to allow for improved illumination control. By selectively turning on/off individual or groups of LEDs, specular reflections can be limited while obtaining images with the image sensors.

Process 590 may continue with operation 594, which includes obtaining images of an interior of the chamber with the plurality of image sensors. In an embodiment, the plurality of image sensors are sequentially activated using multiplexing/demuxing circuitry on the host board of the diagnostic substrate. In an embodiment, the field of view of the image sensors may have a degree of overlap. For example, the field of view of the image sensors may have approximately 20% overlap. The overlap allows for the stitching together of the plurality of images into a single image for ease of analysis.

In an embodiment, the image data may be stored on a memory included in the diagnostic substrate. For example, the images may be stored on an SD card or the like. In other embodiments, the image data may be wirelessly transmitted to an external device, using a wireless communication protocol, such as, but not limited to, WiFi or Bluetooth.

After the images are obtained, the diagnostic substrate is extracted from the chamber. For example, the mainframe robot and FI may work together to transport the diagnostic substrate from the chamber back to the cassette or other storage device. In an embodiment where the image data is stored locally on the diagnostic substrate, the image data may then be downloaded (or the SD card is removed), and the image data is transferred to an external device.

In an embodiment, the external device may include a GUI for easily displaying and analyzing the image data. A single stitched image may be displayed and/or the operator may have the ability to review individual images from the image sensors. Additionally, the image data may be automatically analyzed. The automatic analysis may include the use of machine learning techniques to predict process tool performance, indicate preventative maintenance, deciding if an in chamber cleaning (ICC) process is needed, and/or implementing other monitoring/diagnostic procedures.

As noted above, the use of a diagnostic substrate such as those described herein provide many benefits. One benefit is that the chamber does not need to be taken completely offline. Particularly, the diagnostic substrate has a form factor suitable for handling with automated handling equipment, and the diagnostic substrate is vacuum compatible (e.g., due to the hermetically sealed enclosure around the battery). As such, imaging of the interior of the chamber can be done more frequently since the vacuum does not need to be released or cooled down, so long as the wafer time in the chamber is controlled and monitored. For example, if the wafer becomes too hot, a warning or automatic retract message can be communicated to the wafer handling equipment. Since diagnostics can be implemented more frequently, the time between planned maintenance (PM) events can be increased, which allows for more efficient use of the processing tool. Additionally, diagnostic substrates such as those described herein are a relatively low cost solution. Whereas dedicated sensors within the chamber require all chambers to have their own set of sensors, a diagnostic substrate allows for a single diagnostic tool to be shared with multiple chambers.

Figure 6:
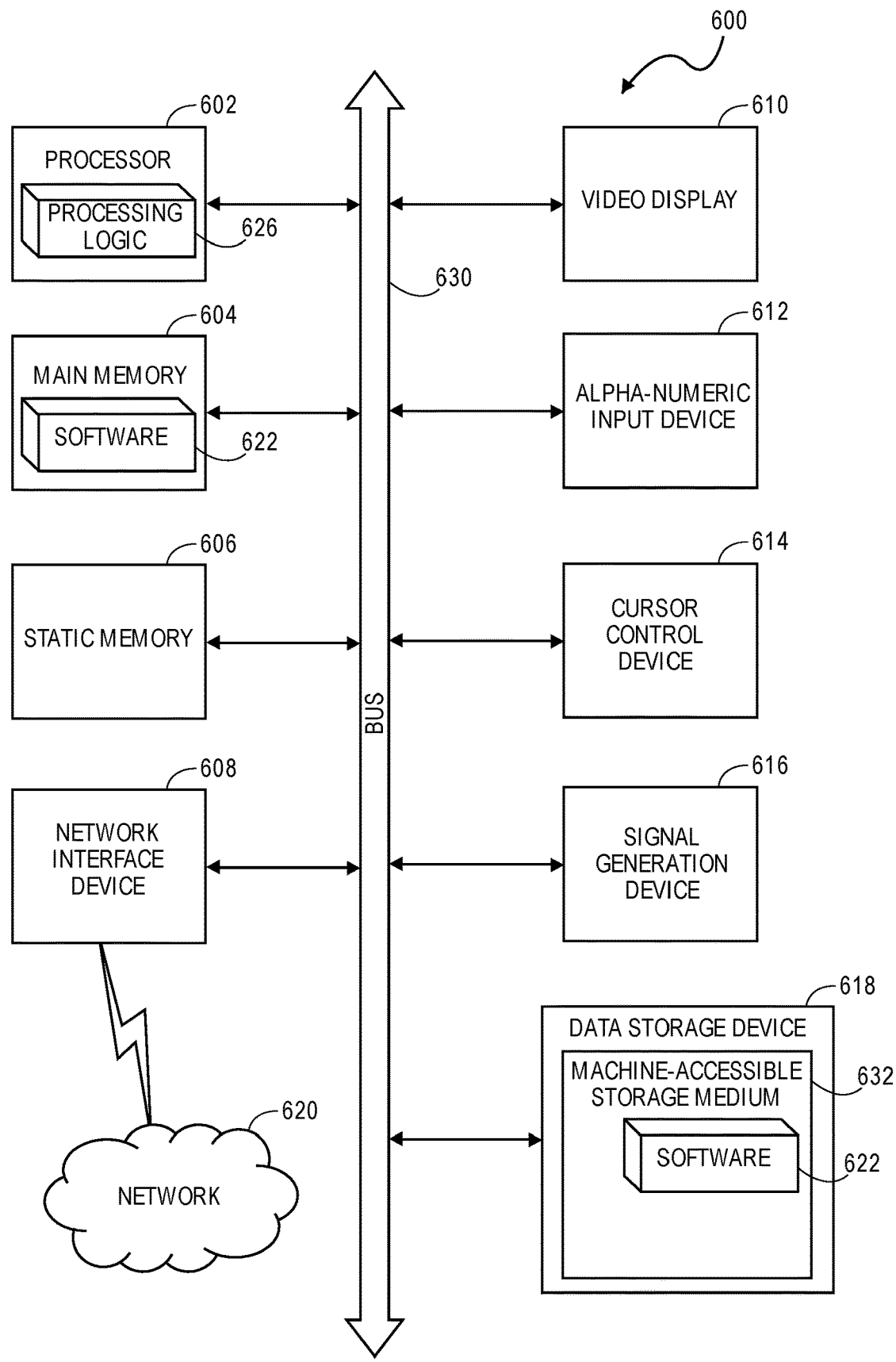
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of monitoring the conditions within a chamber. In an embodiment, the method comprises providing a diagnostic substrate with a plurality of image sensors and a light source. In an embodiment, the method continues with inserting the diagnostic substrate into a chamber. The chamber may be maintained at a vacuum pressure, and therefore does not need to be taken offline. Particularly, the diagnostic substrate is vacuum compatible, and the form factor of the diagnostic substrate is similar to device wafers. As such, machine handling robots of the FI and mainframe may be used to insert the diagnostic substrate into the chamber. In an embodiment, the method may further comprising turning on the light source. In an embodiment, the method may further comprise obtaining images of an interior of the chamber with the plurality of image sensors.

Thus, a diagnostic substrate for imaging the interior of a vacuum chamber and processes for obtaining the images have been disclosed.

What is claimed is:

1. A diagnostic substrate, comprising: a baseplate, the baseplate having a global plane; a plurality of image sensors on the baseplate, wherein the plurality of image sensors comprises circumferentially alternating horizontal image sensors and angled image sensors, each of the horizontal image sensors facing away from the global plane of the baseplate at an orthogonal angle with respect to the global plane of the baseplate, and each of the angled image sensors having a field of view in a direction tilted away from the global plane of the baseplate at a non-orthogonal angle with respect to the global plane of the baseplate; a printed circuit board (PCB) on the baseplate; and a controller on the baseplate, wherein the PCB electrically couples the controller to the plurality of image sensors.

2. The diagnostic substrate of claim 1, further comprising: a light source.

3. The diagnostic substrate of claim 2, wherein the light source comprises a plurality of light emitting diodes (LEDs), wherein the plurality of LEDs are attached to the PCB.

4. The diagnostic substrate of claim 3, wherein the plurality of LEDs are individually controllable or controllable in groups.

5. The diagnostic substrate of claim 1, further comprising: a battery.

6. The diagnostic substrate of claim 5, wherein the battery is housed within a hermetically sealed enclosure.

7. The diagnostic substrate of claim 6, further comprising:
a pressure sensor and/or a volatile organic compound (VOC) sensor within the hermetically sealed enclosure.

8. The diagnostic substrate of claim 1, further comprising: a temperature sensor and/or a vibration sensor.

9. The diagnostic substrate of claim 1, further comprising:
a diffuser cover over the baseplate, the PCB, and the controller.

10. The diagnostic substrate of claim 9, wherein a thickness of the diagnostic substrate is less than 10 mm.

11. The diagnostic substrate of claim 1, wherein the image sensors allow for imaging in the visible spectrum and thermal imaging.

12. A method of imaging the interior of a chamber, comprising: providing a diagnostic substrate, wherein the diagnostic substrate comprises a plurality of image sensors and a light source, the image sensors on a base plate having a global plane, wherein the plurality of image sensors comprises circumferentially alternating horizontal image sensors and angled image sensors, each of the horizontal image sensors facing away from the global plane of the baseplate at an orthogonal angle with respect to the global plane of the baseplate, and each of the angled image sensors having a field of view in a direction tilted away from the global plane of the baseplate at a non-orthogonal angle with respect to the global plane of the baseplate; inserting the diagnostic substrate into the chamber, wherein the chamber is maintained at a sub-atmospheric pressure; turning on the light source; and obtaining images of an interior of the chamber with the plurality of image sensors.

13. The method of claim 12, wherein a multiplexer architecture is used to obtain images from each of the image sensors.

14. The method of claim 12, further comprising:
stitching two or more of the obtained images together to provide a stitched image.

15. The method of claim 12, further comprising:
logging temperature levels at given times to predict failure of a battery or conditions that trigger replacement of the battery.

16. The method of claim 12, wherein machine learning is applied to image data from the interior of the chamber to recognize chamber drift over time and/or to trigger cleaning or other maintenance items.

17. A diagnostic substrate, comprising: a baseplate, the baseplate having a global plane; a first plurality of image sensors on the baseplate, wherein each of the first plurality of image sensors face away from the global plane of the baseplate at an orthogonal angle with respect to the global plane of the baseplate; a second plurality of image sensors on the baseplate, wherein each of the second plurality of image sensors has a field of view in a direction tilted away from the global plane of the baseplate at a non-orthogonal angle with respect to the global plane of the baseplate, wherein ones of the second plurality of image sensors are circumferentially alternating with ones of the first plurality of image sensors; a printed circuit board (PCB) on the baseplate; a controller on the baseplate, wherein the controller is communicatively coupled to the first plurality of image sensors and the second plurality of image sensors by the PCB; and a diffuser lid over the baseplate, the PCB, and the controller.

18. The diagnostic substrate of claim 17, wherein non-orthogonal angle is between 0° and 20° from an orthogonal angle to the global plane of the baseplate.

* * * * *